United States Patent [19]

Crafton et al.

[11] 4,200,462
[45] Apr. 29, 1980

[54] SYSTEM FOR PRODUCING DECORATIVE PLATES FOR PHOTOPRINTING

[76] Inventors: Richard F. Crafton, 65 F Tahoe Cir.; Lawrence Goldberg, 8B Bitter Root Ct., both of Owings Mills, Md. 21117

[21] Appl. No.: 900,485

[22] Filed: Apr. 27, 1978

[51] Int. Cl.² .......................... G03C 5/04; B44C 1/28; B32B 31/18; B29D 7/18; B29C 17/02
[52] U.S. Cl. ........................... 430/494; 156/196; 156/264; 156/266; 156/304; 156/63; 264/158; 264/245; 264/297; 354/75; 428/38; 428/484; 430/9; 430/644
[58] Field of Search ................ 96/27 R; 156/63, 196, 156/264, 266, 304; 264/158, 162, 163, 245, 255, 261, 297; 353/22, 121; 354/75, 100; 428/38, 484

[56] References Cited

U.S. PATENT DOCUMENTS

| | | | |
|---|---|---|---|
| 235,799 | 12/1880 | Naylor | 264/158 |
| 579,878 | 3/1897 | Köster | 264/158 X |
| 1,200,489 | 10/1916 | Grumman | 264/158 X |
| 1,572,348 | 2/1926 | Carow | 156/265 X |
| 1,789,081 | 1/1931 | Payne | 264/158 X |
| 1,814,641 | 7/1931 | Smith et al. | 264/158 X |
| 2,018,690 | 10/1935 | Trempalla | 353/121 X |
| 3,166,973 | 1/1965 | Healey | 353/121 |
| 3,247,299 | 4/1966 | Zaha | 264/158 |
| 3,796,571 | 3/1974 | Lerman | 264/245 X |
| 3,993,813 | 11/1976 | Grieco et al. | 264/158 X |

Primary Examiner—John T. Goolkasian
Assistant Examiner—Robert A. Dawson
Attorney, Agent, or Firm—John F. McClellan

[57] ABSTRACT

A system for producing decorative plates for photoprinting includes forming variously colored translucent wax layers into a laminar bar from which transverse thin sections are cut and mosaicked edge-to-edge on a transparent support, back-lighted and photographed to produce a positive transparency; both pre-sectioning and post sectioning distortions are employed and a matching "open face" disposition pattern provides symmetry.

4 Claims, 8 Drawing Figures

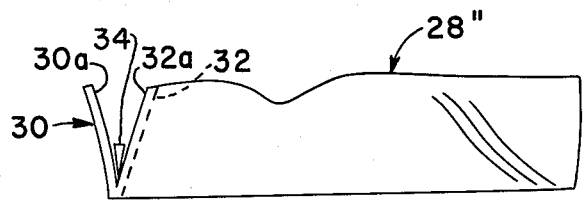
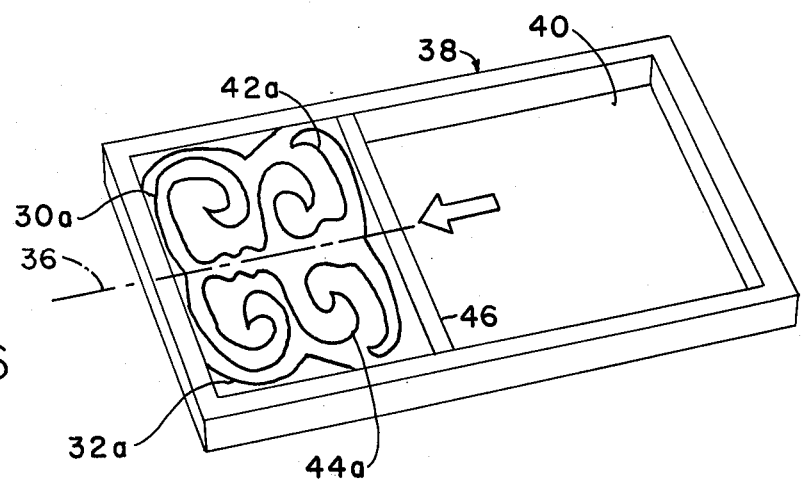
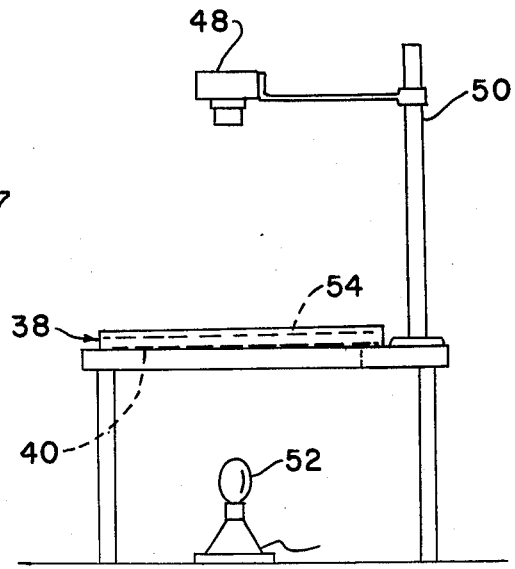
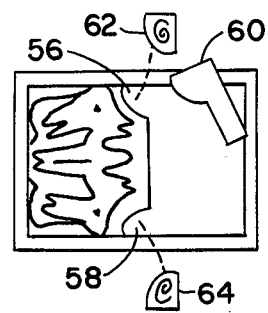

SYSTEM FOR PRODUCING DECORATIVE PLATES FOR PHOTOPRINTING

This invention relates generally to photographic plate making for printing designs and specifically to working plastic materials to form the designs.

In the prior art various U.S. patents have disclosed teachings, including:

No. 235,799 to J. Naylor, 12-21-80, discloses forming a cylinder by rolling up layers of different colored plastic materials and cutting transverse sections to make the final product. Post distortion is taught.

No. 3,993,813 to G. C. R. Grieco et al, 11-23-76, discloses a process for making stained glass windows by laying up and cementing glass elements in a mold and slicing off transverse sections.

No. 1,789,081 to D. D. Payne, 1-13-31, discloses forming a cylinder of twisted-together plastic elements which have various colors and may be at least in part transparent, and working the cylinder to unite the elements and produce a mottled pattern, after which the cylinder is divided to yield a plurality of patterned bodies.

No. 1,814,641 to H. E. Smith et al, 7-14-31, discloses laminating plastic to form a cylinder, slitting the cylinder length and flattening the laminate, distorting the laminate pattern and cutting off individual pieces from it.

No. 3,247,299 to J. Zaha, 4-19-66, discloses transversely slicing tile from a slab.

No. 1,200,489 to V. W. Grumman, 10-10-16 discloses making a slab by veining a plastic mass with color, using layers with coloring material between, and cutting the slab to reveal the veining.

No. 579,878 to C. Koster, 3-31-97, discloses slicing a mass to produce patterned veneer.

A principal object of the invention is to provide a system for making strikingly colored and patterned photoprinting plates which is orders of magnitude faster than but compatible with laborious hand mosaicking.

Further objects are to provide a system as described which is economical, relatively easy and safe to learn and practice by those skilled in the art, which yields new patterns and color combinations in practically infinite proliferation, which is closely controllable to produce particular types of patterns and color combinations as desired, and which requires a minimum of apparatus.

In brief summary given for purposes of cursive description only and not as limitation, the invention includes a system employing wax type material folded, cut, mosaicked and photographed in particular ways to produce plates for photoprinting and transferring new patterns and color combinations formed.

The above and other objects and advantages of this invention will become more evident on examination of the following description, including the drawings in which like reference numerals refer to like parts.

FIG. 5 is a side elevational further sequential view;

FIG. 6 is a perspective further sequential view;

FIG. 7 is a side elevational further sequential view; and

FIG. 8 is a plan view showing an optional technique.

Figure 1:
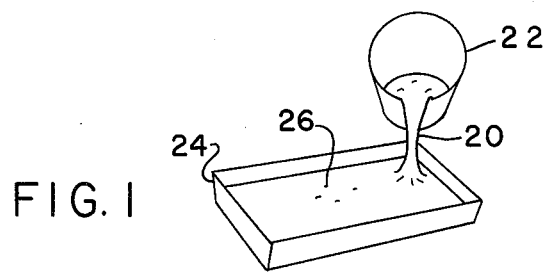
FIGS. 1 and 4 are perspective sequential views of the system of the invention in an exemplary embodiment.

FIG. 1 shows a first stage in the invention, forming a layer of wax by pouring heat-liquified wax 20 from a container 22 into a flat pan 24 to form a single layer 26. This is repeated in other pans, not shown, with waxes colored differently to provide plural layers for the next stage.

Conveniently, as one example, pans may be put about ten by sixteen inches (25 cm×40 cm), layers may be from paper thickness to perhaps one inch (25 mm) thick, and the wax may optimally be low melting point paraffin such as that supplied by Citgo Corporation as "Citgo 135 paraffin".

Any conventional oil-base wax dyes may be used to color the paraffin. Preferably a hardening agent such as that manufactured by Eastman Kodak Company under the name "Epolene" and comprising low molecular weight polyethylene resin is melted from solid form and is mixed in the proportion of two tablespoons with each gallon of the paraffin when liquid to reduce bubble formation, providing clearer translucency for the photographic step.

Figure 2:
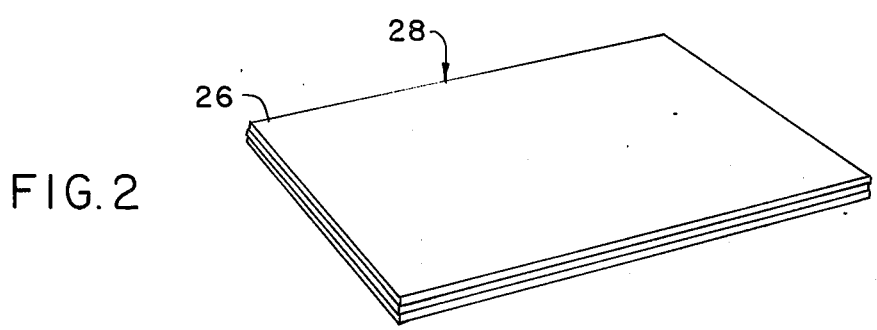

FIG. 2 shows the next step, forming a planar laminat of the warm, pliable wax layers 26 removed from the pans. Care is taken to prevent air entrapment between the layers by progressively contacting any given layer with the next adjacent layer in the laminate 28.

Figure 3:
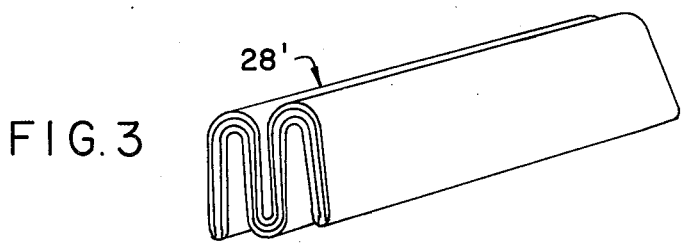

FIG. 3 shows a preferable detail as next step, forming the laminate into an accordion pleated longitudinal mass 28'.

Figure 4:
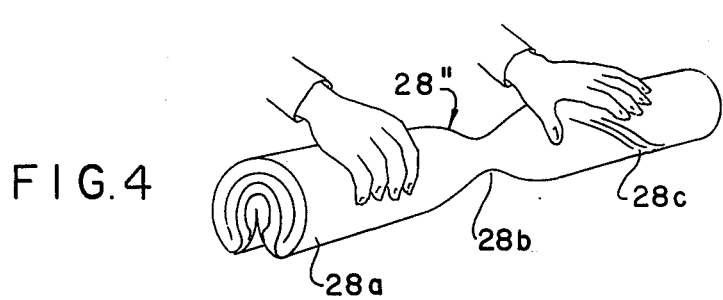

FIG. 4 shows the longitudinal mass being preformed relative to the next step, preferably by rolling into the shape of a cylindrical, elongate bar 28''. The laminae are preferably longitudinal in the bar. Pinching as at 28a, stretching and producing a reduced-transverse-measurement region therein as at 28b, and twisting as at 28c may advantageously be employed without destroying the symmetry of the end-product as result of a further provision of the combination of the invention, described in reference to the next step.

FIG. 5 shows the next step, transversely slicing matching sections 30, 32 of about one-eighth inch (3 mm) thickness from the bar as by using a blade 34. These sections need not be sliced completely apart where pairs are to be used, one section on each side of the centerline, but can be opened up as about a hinge of unsliced material so that separated contiguous faces 30a, 32a become the top faces of a pair. This "open face" technique and product have a profound effect on the design because the top faces are the faces in-focus and not softened by transmissive scattering as viewed from the top; consequently practically exact symmetry and register of the in-focus portions can be preserved while subtle variations and modulations of lower portions show through and visually accentuate as indicated by the next two Figures.

FIG. 6 shows "open face" or paired sections, with cut-contiguous, separated faces 30a, 32a up as they appear in symmetrical disposition about the centerline 36 of a pattern formed in a frame 38 having a translucent (preferably uniformly-scattering ground glass) bottom 40 according to this invention. Adjacent sections are preferably treated in like manner so that the faces 42a, 44a of them are up can be added until the frame is filled; pressure of a molding element 46 may be used to slide (arrow) and plastically force the sections to fill the frame while preserving symmetry. The frame is shown is a rectangle but may be of other shape, preferably predetermined.

FIG. 7 shows a final step, photographing the section-formed pattern with a camera 48 mounted on a stand 50 above the upper face of the frame 38, under illumination provided by a back-lighting source 52 beneath the frame. The ground glass evens the illumination, and an upper, transparent plate 54 may be mounted on the top of the sections in the frame to even the thickness of the sections, also evening illumination and unifying focus of the top portion of the pattern formed by the sections.

FIG. 8 illustrates an optional technique in which symmetrical openings 56 and 58 are molded in the pattern as by a curved molding element 60, and selected inserts 62, 64 of wax are symmetrically set into the pattern in the openings. It will be appreciated that the openings occur naturally or without effort to make them when according to another provision of this invention undersize sections are taken from the bar at a reduced-section portion as at 28b in the fourth Figure. In this manner the frame may be filled without the post-sectioning distortion which is a feature of the invention, if desired.

This invention is not to be construed as limited to the particular forms disclosed herein, since these are to be regarded as illustrative rather than restrictive. It is, therefore, to be understood that the invention may be practiced within the scope of the claims otherwise than as specifically described.

What is claimed and desired to be protected by United States Letters Patent is:

1. The process for making a decorative pattern-photographic transparency comprising the steps:
   a. producing a plurality of light transmitting wax sheets of different colors;
   b. maintaining the plurality of wax sheets at a temperature rendering them pliable;
   c. forming a laminate of the plurality of wax sheets;
   d. forming the laminate into an elongate bar;
   e. deforming said elongate bar;
   f. producing a plurality of transverse sections of the elongate bar;
   g. mosaicking the plurality of sections on a translucent support;
   h. backlighting the mosaic; and
   i. forming a photographic transparency of the backlighted mosaic.

2. In the process recited in claim 1: in step g., in the mosaicking arranging separated contiguous faces of adjacent sections in an upward "open face" relation symmetrical about a centerline.

3. In the process recited in claim 2, in the mosaicking forcibly molding sections to a predetermined shape producing reduced-transverse-measurement-regions, and filling in symmetrically around the sections at the reduced-transverse-section region.

4. The product formed by the process recited in claim 1.

* * * * *